(12) United States Patent
Duffy et al.

(10) Patent No.: US 10,343,894 B2
(45) Date of Patent: Jul. 9, 2019

(54) MEMS DEVICE AND PROCESS

(71) Applicant: Cirrus Logic International Semiconductor Ltd., Edinburgh (GB)

(72) Inventors: Stephen Duffy, Glasgow (GB); Colin Robert Jenkins, Linlithgow (GB); Tsjerk Hans Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 57 days.

(21) Appl. No.: 15/676,430

(22) Filed: Aug. 14, 2017

(65) Prior Publication Data

US 2018/0050900 A1 Feb. 22, 2018

Related U.S. Application Data

(60) Provisional application No. 62/377,875, filed on Aug. 22, 2016.

(30) Foreign Application Priority Data

Oct. 4, 2016 (GB) .................................... 1616862.7

(51) Int. Cl.
| | |
|---|---|
| *H04R 19/00* | (2006.01) |
| *B81B 3/00* | (2006.01) |
| *B81C 1/00* | (2006.01) |
| *H04R 7/06* | (2006.01) |
| *H04R 19/04* | (2006.01) |

(52) U.S. Cl.
CPC ........ *B81B 3/0072* (2013.01); *B81C 1/00666* (2013.01); *H04R 7/06* (2013.01); *H04R 19/005* (2013.01); *H04R 19/04* (2013.01); *B81B 2201/0257* (2013.01); *B81B 2203/0127* (2013.01); *B81B 2203/04* (2013.01); *B81B 2207/03* (2013.01); *H04R 2201/003* (2013.01)

(58) Field of Classification Search
CPC .......... B81B 3/0072; B81B 2201/0257; B81B 2203/0127; B81B 2201/003; B81B 2207/03; B81C 1/0066; H04R 7/06; H04R 19/005; H04R 19/04
See application file for complete search history.

(56) References Cited

U.S. PATENT DOCUMENTS

2010/0090298 A1* 4/2010 Shih .................... B81C 1/00587
257/419
2011/0241137 A1 10/2011 Huang et al.

FOREIGN PATENT DOCUMENTS

| DE | 102013217300 A1 | 5/2014 |
|---|---|---|
| EP | 1881737 A2 | 1/2008 |
| GB | 2515836 A | 1/2015 |

(Continued)

OTHER PUBLICATIONS

International Search Report and Written Opinion of the International Searching Authority, International Application No. PCT/GB2017/052326, dated Oct. 13, 2017.

(Continued)

*Primary Examiner* — Brian Ensey
(74) *Attorney, Agent, or Firm* — Jackson Walker L.L.P.

(57) ABSTRACT

The application describes a MEMS transducer comprising a layer of conductive material provided on a surface of a layer of membrane material. The layer of conductive material comprises first and second regions, wherein the thickness and/or the conductivity of the/each first and second regions is different.

22 Claims, 6 Drawing Sheets

(56) References Cited

FOREIGN PATENT DOCUMENTS

| JP | 2003211393 A | 7/2003 |
|---|---|---|
| KR | 2003-0075906 | 9/2003 |
| KR | 20030075906 A | 9/2003 |

OTHER PUBLICATIONS

Combined Search and Examination Report under Sections 17 and 18(3), UKIPO, Application No. GB1616862.7, dated Sep. 26, 2018.
Examination Opinion of the Taiwan Intellectual Property Office, Application No. 106128119, dated Oct. 29, 2018.
Combined Search and Examination Report under Sections 17 and 18(3), United Kingdom Intellectual Property Office, Application No. GB1616862.7, dated Nov. 14, 2016.
Rejection Decision of the Taiwan Intellectual Property Office, Application No. 106128119, dated Apr. 18, 2019.

* cited by examiner

MEMS DEVICE AND PROCESS

FIELD OF DISCLOSURE

The present disclosure relates to a micro-electro-mechanical system (MEMS) device and process, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between a pair of electrodes which will vary as the distance between the electrodes changes in response to sound waves incident on the membrane surface.

Figure 1A:
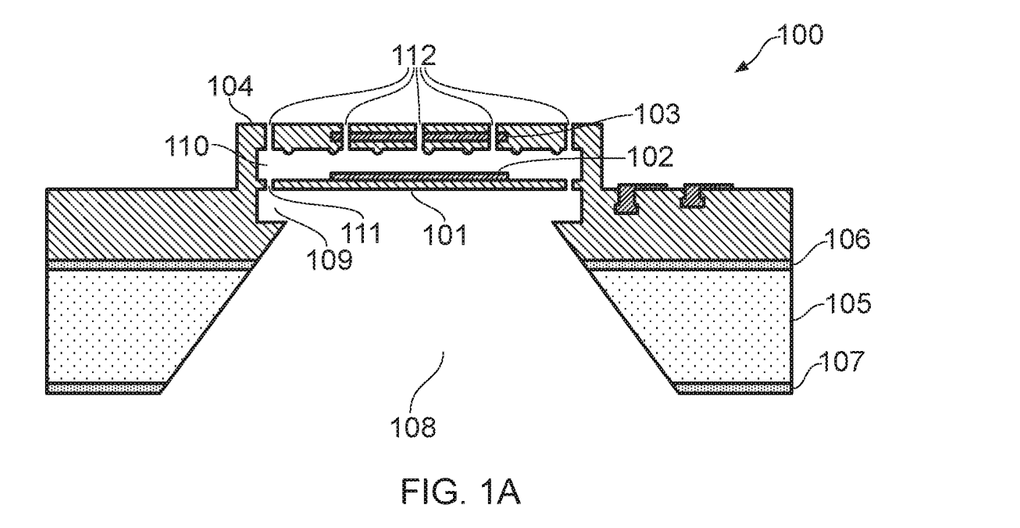
FIGS. 1a and 1b illustrate known capacitive MEMS transducers in section and perspective views.
Figure 1B:
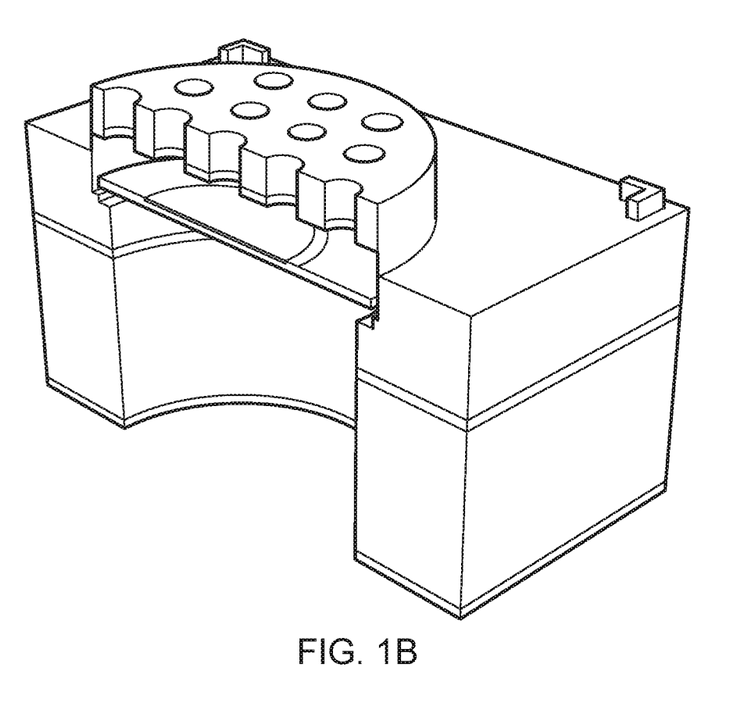

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown). The bleed holes allow the pressure in the first and second cavities to equalise over a relatively long timescale (in acoustic frequency terms) which reduces the effect of low frequency pressure variations, e.g. arising from temperature variations and the like, but without impacting on sensitivity at the desired acoustic frequencies.

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Typically the flexible membrane layer 101 and membrane electrode 102 may be fabricated so as to be substantially planar in the quiescent position, i.e. with no pressure differential across the membrane, as illustrated in FIG. 1a. The flexible membrane layer may be formed so as to be substantially parallel to the back-plate layer in this quiescent position, so that the membrane electrode 102 is parallel to the back-plate electrode 103. However, over time, the membrane structure may become deformed—e.g. as a consequence of relatively high or repeated displacement—so that it will not return to exactly the same starting position.

A number of problems are associated with the previously considered transducer designs. In particular both the membrane and the membrane electrode will suffer intrinsic mechanical stress after manufacture, for instance due to being deposited at relatively high temperatures of a few hundred degrees Celsius and desiring on return to room temperature to contract by different amounts due to greatly different thermal coefficients of expansion yet being intimately mechanically coupled together. Not being able to immediately dissipate the stored energy due to the stress, i.e. not able to fully release the stress by independent mechanical contraction, the composite structure of electrode and membrane will tend to deform, similar to the well-known operation of bi-metallic strip thermostat sensors. Over a long time, especially when subject to repeated mechanical exercising as typical of a microphone membrane in use, the metal electrode layer in particular may be subject to creep or plastic deformation as it anneals to reduce its stored stress energy—being unable to release it in any other way. Thus, the equilibrium or quiescent position of the membrane structure comprising the flexible membrane and the membrane electrode is sensitive to manufacturing conditions from day one and can also change over time.

Figure 2:
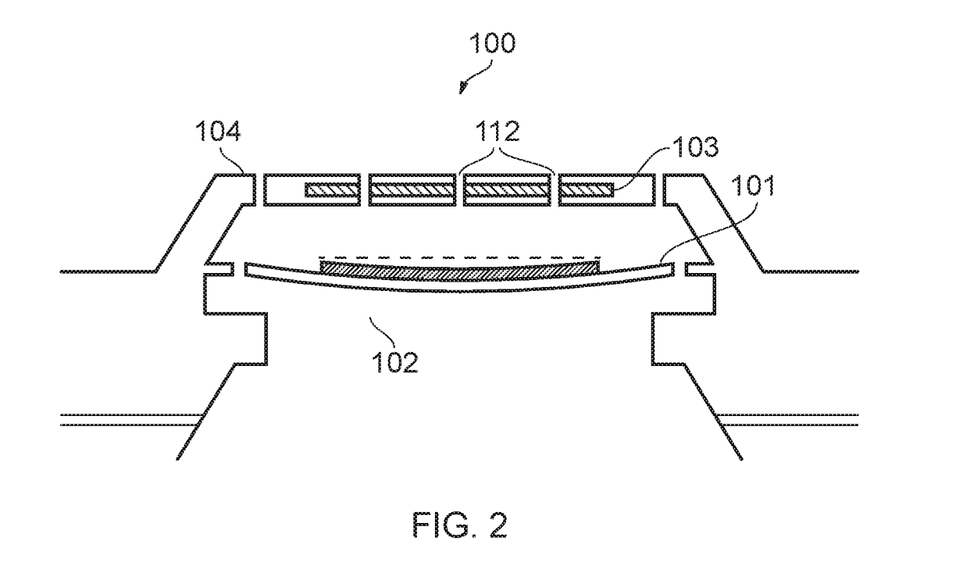
FIG. 2 illustrates how a membrane may be deformed.

FIG. 2 illustrates the permanent deformation which can occur to the quiescent position of the membrane 101/102 over time. It can be seen that the quiescent position of the membrane, and thus the spacing between the back-plate electrode 103 and the membrane electrode 102, therefore changes from its position immediately after manufacture—shown by the dashed line—to the deformed quiescent position. This can lead to a DC offset in the measurement signal from such a transducer, as the capacitance at the quiescent position is not the same. More importantly, for a.c. audio signals, the change in capacitance leads to a variation in the signal charge for a given acoustic stimulus, i.e. the acousto-electrical sensitivity of the microphone.

In addition, the elasticity of the composite electrode-membrane structure 101/102 is sensitive to the mechanical stress of the electrode and membrane layers. Any variation in manufacturing conditions and the subsequent stress release via metal creep or suchlike will affect the values of the stress of these layers. The deformation due to the stress mismatch will also directly affect the values of quiescent stress.

Thus, it can be appreciated that the membrane structure and associated transducer may suffer an increased manufacturing variation in initial sensitivity and furthermore experience a change—or drift—in sensitivity over time meaning that the transducer performance cannot be kept constant.

Furthermore, the metal of the membrane electrode may undergo some plastic deformation as a consequence of relatively high or repeated displacement from the quiescent/equilibrium position. Thus, the metal of the membrane electrode may be deformed so it will not return to its original position. Since the flexible membrane 101 and the membrane electrode 102 are mechanically coupled to one another this can also lead to an overall change in the quiescent position of the flexible membrane 101 and/or a change in the stress properties and thus the elasticity of the overall membrane structure.

SUMMARY

The present disclosure relates to MEMS transducers and processes which seek to alleviate some of the aforementioned disadvantages, in particular by providing a transducer which exhibits an improved consistency in sensitivity or performance initially and over time.

According to a first aspect of the present invention there is provided a MEMS transducer comprising:

a substrate having a cavity;

a layer of membrane material provided relative to the substrate, wherein the membrane material extends over the cavity;

a layer of conductive material provided on a surface of the layer of membrane material; the layer of conductive material comprising at least one first region having a first thickness and a first conductivity and at least one second region having a second thickness and a second conductivity, wherein the thickness and/or the conductivity of the first and second regions is different.

It will be appreciated that the first and second regions, which may be formed of different materials, form an "electrically continuous" conductive layer on the surface of the membrane. The electrically continuous layer may comprise a sheet of conductive material or may comprise a conductive layer having one or more perforations or apertures within the conductive layer.

The transducer comprises a layer of membrane material which may be supported in a fixed relation relative to the underlying substrate and extends over a cavity in the substrate. The region of the membrane which extends over the cavity may be considered to form the flexible membrane of the transducer. Thus, any conductive material which is disposed on a surface of the flexible membrane region can be considered to form a membrane electrode of the transducer which is utilised for sensing movement of the flexible membrane.

According to examples of the present disclosure, the first region of the conductive layer exhibits at least one material property that differs compared to the same material property of the second region. Preferably, material properties of the first region and the second region of the conductive material provided on the membrane surface are selected so as to facilitate/achieve different performance requirements in different regions of the membrane. According to preferred examples, the thickness and/or conductivity of the/each of the first and second regions are different. As a result, the conductance of the first and second regions may be different.

According to one example, the thickness of the conductive material (i.e. the z-dimension of the conductive layer) in the second region may be greater than the thickness of the conductive material in the first region. Thus, the/each first region may be considered to be a "thinner" region of conductive material whilst the/each second region may be considered to be a "thicker" region of conductive material.

Alternatively or additionally, the different regions of the conductive layer may be formed from different materials having different intrinsic conductivity. For example, the conductivity of the conductive material forming the/each second region of the conductive layer may be greater than the conductivity of the conductive material forming the/each first region of the conductive layer. For example, the first region of the conductive layer may be formed of a conductive dielectric such as titanium nitride, polysilicon, silicon carbide, amorphous silicon or tantalum nitride. The second region of the conductive layer may be formed of a metal, such as aluminium, or a metal-alloy such as aluminium-silicon alloy or titanium nitride.

In the region of the membrane layer that overlies the cavity and forms a flexible membrane of the cavity, the conductive layer serves as a capacitive plate or membrane electrode. Thus, changes in membrane position are measured by changes in the capacitance between the membrane electrode and a backplate electrode. In this region the need arises to mitigate the mechanical mis-match between the mechanical properties of the membrane and the conductive electrode in order to e.g. alleviate the time-dependent drift of the MEMS transducer.

According to examples where the/each first region of the conductive layer is thinner than the/each second region of the conductive layer, it is desirable for the first region of the conductive layer to comprise at least a part of the region where the conductive material is deposited on the flexible membrane region overlying the substrate cavity. It will be appreciated that the material strain arising as a result of the mechanical coupling between the conductive layer and the underlying membrane layer is proportional to the ratio of the amount/volume of the conductive material relative to the surface area of the adjoining membrane layer. Thus, according to such an example the stress and/or deformation arising as a result of the mis-match between mechanical properties of the membrane and the conductive layer may be mitigated.

Conductive dielectrics, such as those suggested above, typically exhibit a conductivity which is several orders of magnitude lower than that of metals. However, when employed as a first region of the conductive layer on the region of the membrane layer that overlies the cavity to form the membrane electrode, the lower conductance is mitigated by the relatively large area of the material. Moreover, conductive dielectrics offer a number of properties which make them beneficial for forming part of the conductive layer, in particular for forming the membrane electrode. For example, in contrast to metal, conductive dielectrics tend to exhibit a thermal expansion coefficient that more closely matches that of the adjoining membrane layer. Thus, the mechanical stress arising in the dual layer structure is reduced and the susceptibility of the structure to experience a drift in sensitivity over time is also reduced.

The ability to form a composite membrane electrode structure which exhibits a lower inherent stress advantageously allows the area of the electrode to be increased, thus enabling the overall capacitance of the transducer structure to be increased.

In addition to forming a conductive electrode on the flexible membrane, the conductive layer may also form a track for transporting a signal from the membrane electrode to a region for electrically coupling the transducer to circuitry for readout. The track region is relatively small and, as such, it is desirable for the conductance of this region to relatively high. According to one example of the present invention, the track may be formed of a second region of the conductive layer, which second region is thicker than the first region and/or exhibits a higher conductivity than the first region.

The/each second region may comprise at least a region provided on a region of the membrane which is laterally outside the region of the membrane which overlies the cavity. Alternatively or additionally, the second region may comprises at least a region overlying any changes in the topology of the underlying membrane layer—e.g. at the step change between an upper layer and a lower layer of the membrane layer.

The conductive layer may alternatively or additionally comprise one or more thicker and/or higher conductivity regions on a region of the membrane that overlies the cavity. These regions will thus form part of the membrane electrode. Thus, the second region of the conducive layer may comprises one or more elements or interconnected tracks which are provided on a region of the membrane which overlies the cavity. Thus, the second regions could form a plurality of discrete elements, or interconnected tracks/veins. Such an example may be formed by depositing a first sub-layer of conductive material onto the membrane surface, thereby forming the geometry/pattern of the eventual elements or tracks of the second region. Then, a second sub-layer of conductive material may be subsequently deposited, to form the first region of the conductive material either as a continuous layer or selectively deposited to incorporate one or more openings (e.g. as lattice), so that the regions where the second sub-layer of conductive material is deposited on top of the first sub-layer will form thicker regions of conductive material (and will form part of the "second region" according to examples of the present invention), and the regions where the second sub-layer of conductive material is deposited directly onto the surface of the membrane will form thinner regions of conductive regions (and will form part of the first region according to examples of the present invention).

According to examples which comprise a layer of conductive material comprising regions of differing thickness, it will be appreciated that the layer of conductive material may be formed in a number of ways. For example, the layer of conductive material may comprise a plurality of sub-layers of conductive material which are deposited in different stages. The sublayers may comprise the same or different material. Thus, it is possible to build up thicker regions of the conductive layer, e.g. from more than one deposited layer. One or more of the sub-layers may be considered to be patterned in the x-y plane. Thus, one or more of the sub-layers may comprise a conductive layer having one or more perforations or apertures within the conductive layer.

Alternatively, it is possible to remove previously deposited conductive material to form one or more thinner regions of conductive material.

It is convenient to consider the locations of the different regions of the layer of conductive material with respect to their projected position in an x/y plane defined by the plane of flexible membrane region of the layer of membrane material. Thus, according to examples of the present invention, the first and second regions may be provided at different projected positions relative to the plane of the flexible membrane.

According to a further aspect of the present invention there is provided a MEMS transducer comprising a layer of membrane material and a layer of conductive material provided on a surface of a layer of membrane material, wherein the layer of conductive material comprises first and second regions, and wherein the thickness and/or the conductivity of the/each first and second regions is different.

According to a further aspect of the present invention there is provided a method of forming a MEMS transducer having a flexible membrane, the method comprising: forming a layer of conductive material on the surface of the membrane, selectively removing some of the layer of conductive material to form one or more regions of reduced thickness.

According to a further aspect of the present invention there is provided a method of forming a MEMS transducer having a layer of membrane material supported relative to a substrate, the method comprising: first and second deposition steps to deposit a layer of conductive material on a surface of the layer of membrane material, the layer of conductive material comprising at least one first region and at least one second region.

The first deposition step may comprise depositing a first material having a first electrical conductivity and the second deposition step may comprise depositing a second conductive material having a second electrical conductivity.

The transducer may comprise a back-plate structure wherein the flexible membrane layer is supported with respect to said back-plate structure. The back-plate structure may comprises a plurality of holes through the back-plate structure.

The transducer may be a capacitive sensor such as a microphone. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given example.

Associated methods of fabricating a MEMS transducer are provided for each of the above aspects.

BRIEF DESCRIPTION OF THE DRAWINGS

For a better understanding of the present invention and to show how the same may be carried into effect, reference will now be made by way of example to the accompanying drawings in which.

DETAILED DESCRIPTION

FIGS. 3a to 3d each show a cross-sectional view through various example structures comprising a layer 10 of membrane material, which extends across a cavity formed in a substrate 105 to form a flexible membrane 101, and a layer 115 of conductive material deposited on the surface of the layer of membrane material. In each example the conductive layer comprises at least one first region A having a first thickness and a first conductivity and at least one second region B having a second thickness and a second conductivity. In this example the second region B has a greater thickness than the first region.

The first and second regions are seen to be provided at different positions relative to the x/y plane of the flexible membrane.

Figure 3A:
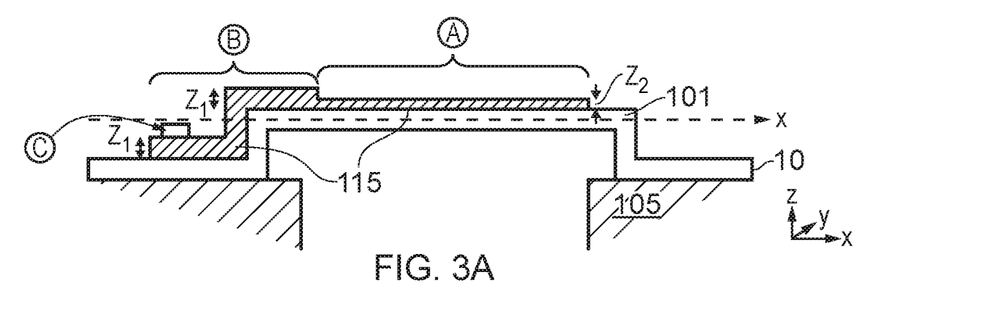
FIGS. 3a to 3d each show a cross-sectional view through various example structures.

According to the example shown in FIG. 3a the conductive layer is initially deposited as a single layer having an initial thickness of $Z_1$. Some of the conductive material is then selectively removed from the layer of conducive material in the region that overlies the substrate cavity. The resulting first region has a thickness of $Z_2$ which is less than $Z_1$.

Figure 3B:
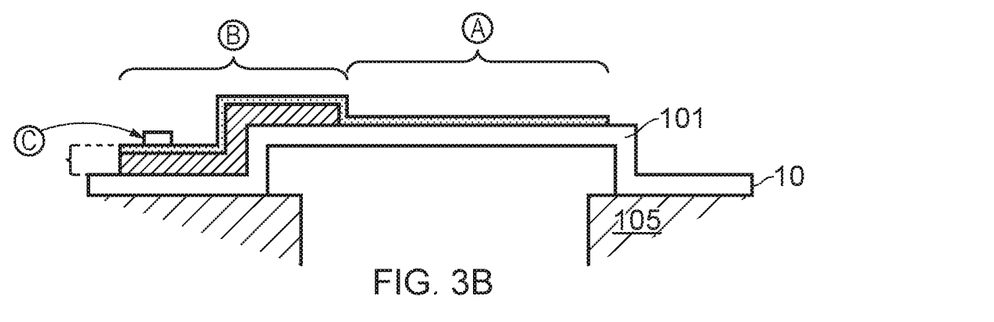
Figure 3C:
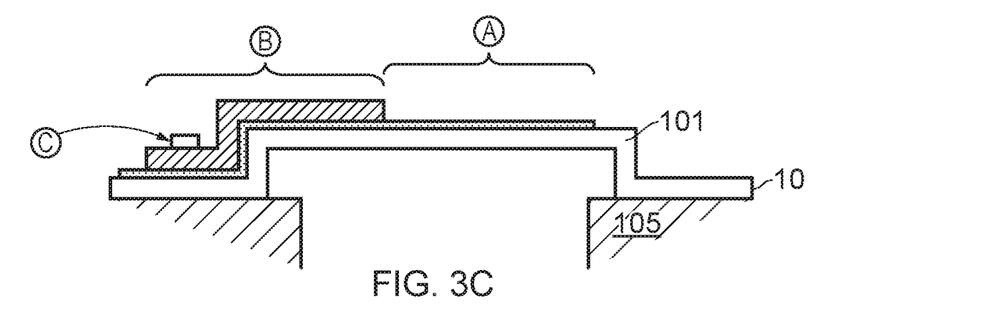
Figure 4:
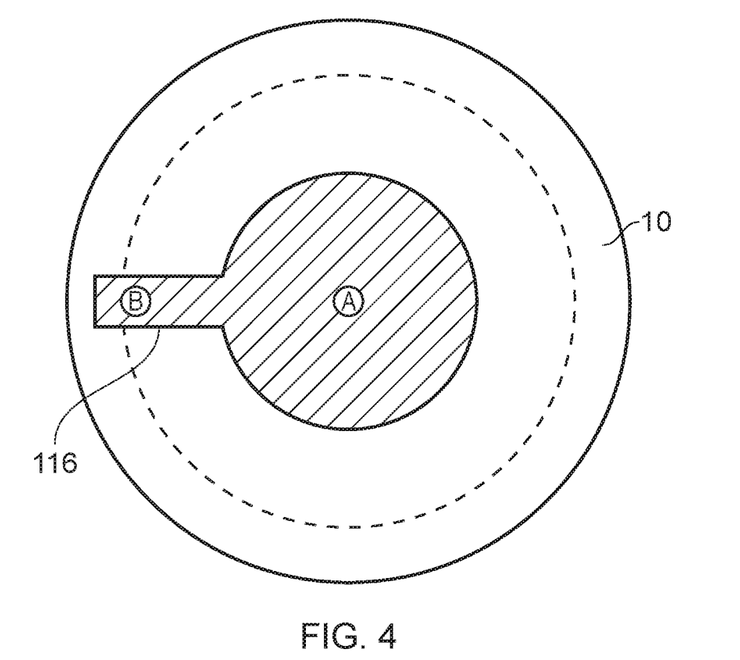
FIG. 4 illustrates a top view of the structure shown in FIGS. 3a to 3c.

As shown in FIG. 4, which illustrates a top view of the structure shown in FIGS. 3a to 3c, the thicker, second, region B of the conductive layer forms a conductive track 116 at the periphery of the flexible membrane. The conductive track connects the membrane electrode formed by the conductive layer in the region overlying the substrate cavity to a region C at the periphery of the transducer for electrically coupling the electrode to circuitry (not shown). As indicated by the dashed line, the membrane layer exhibits a step change between an upper membrane layer which extends over the substrate cavity and a lower membrane layer. Thus, the conductive track formed by region B of the conductive layer is provided on a region of the layer of membrane material which includes the step discontinuity.

According to the examples shown in FIGS. 3b and 3c, the conductive layer is formed of two sub-layers by two distinct deposition steps. In FIG. 3b, a first deposition step comprising the deposition of a first sub-layer of conductive material results in the partial formation of the second region B of the conductive layer. A second deposition step comprising the deposition of a second sub-layer of conductive material, which in this example is the same conductive material that is deposited in the first deposition step, results in the completion of the second region B of the conductive layer having a thickness $Z_1$ and the formation of the first region A having thickness $Z_2$.

In FIG. 3c, a first deposition step comprising the deposition of a first sub-layer of conductive material results in the formation of the first region A and the partial formation of the second region B of the conductive layer. A second deposition step comprising the deposition of a second sub-layer of conductive material results in the completion of the second region B of the conductive layer.

Figure 3D:
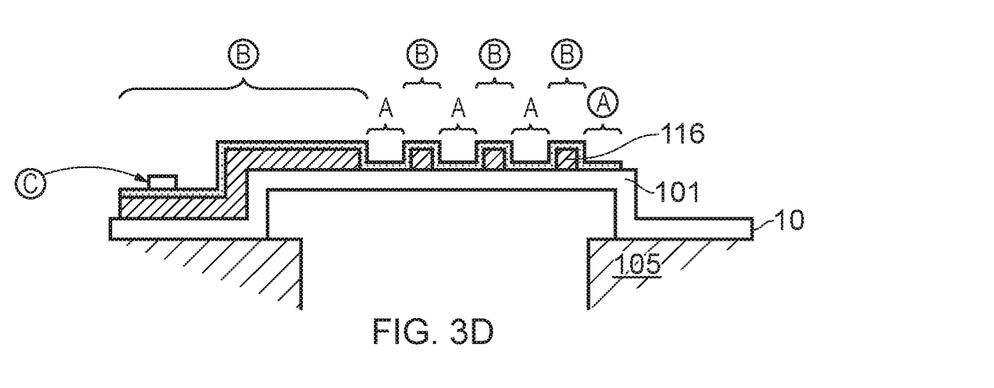

FIG. 3d shows another example of a conductive layer. According to this example the second region B of the conductive layer forms the conductive track 115 as well as forming a plurality of supplemental, conductive tracks 116 which will extend across the flexible membrane region. It will be appreciated that FIG. 3d shows a cross-sectional view through the transducer structure and that the plurality of supplemental tracks 116 are actually interconnected and may, for example, be formed from a perforated sub-layer of conductive material.

Figure 5:
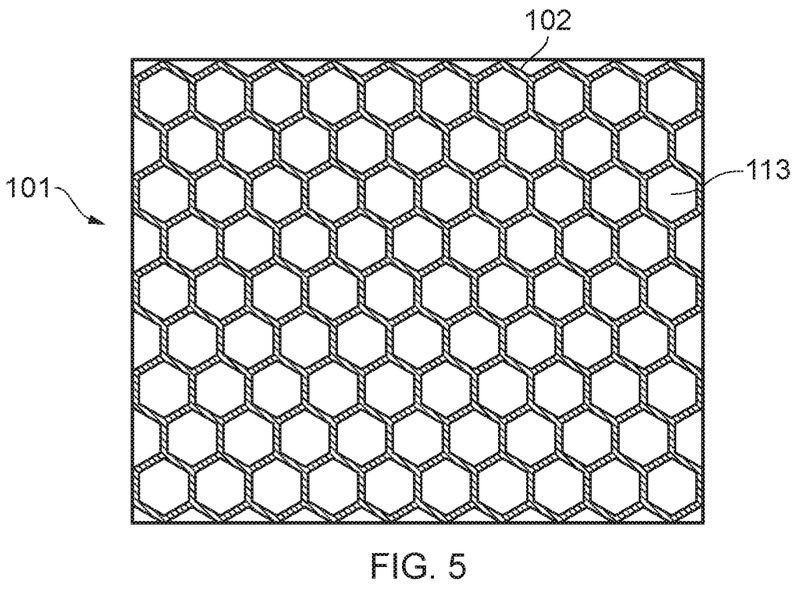
FIG. 5 shows an example of a perforated sub-layer of a conductive layer.

According to the FIG. 3d example one of the sub-layers of the conductive layer is patterned by a plurality of perforations or openings that extend through the sub-layer of conductive material, whilst the other sub-layer which forms the first regions A of the conductive layer. An example of a perforated sub-layer is shown in FIG. 5. It will be appreciated, however, that both of the sub-layers may be perforated.

The first region of the conductive layer is formed by deposition of a thinner sub-layer of conductive material. In this example, as with FIG. 3b, the first region is formed by a second deposition step subsequent to a first deposition step which partially forms the second regions and which determines the geometry/pattern of the second region.

The plurality of supplemental, conductive tracks 116 serve to supplement/enhance the capacitance of the conductive layer in the region of the flexible membrane and, thus, improve the sensitivity of the transducer. The supplemental conductive tracks can therefore be considered to form a part of the membrane electrode. Thus, the membrane electrode (comprising at least that part of the conductive layer that is disposed above the flexible) comprises a first, relatively thin region A, as well as a second, relatively thick, region, B.

Figure 6A:
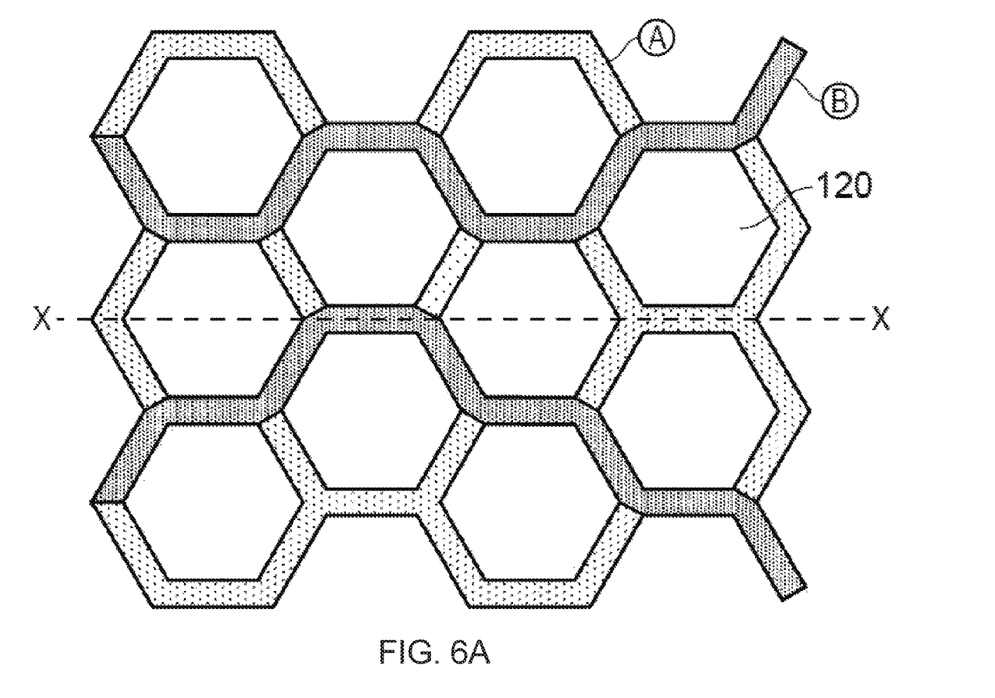
FIG. 6a shows a plan view of a part of a conductive layer according to a further example.

FIG. 6a shows a plan view of a part of a conductive layer according to a further example. As shown in FIG. 6a the conductive layer is formed of first and second sublayers wherein both sub-layers are provided with openings 120 in the conductive sub-layer. The first and second sub-layers of conductive material can be considered to form a first region A and a second region B of the conductive layer.

The first region A is formed of a single sub-layer of conductive material and, consequently, is thinner than the second region B of the conductive layer. The second region B is formed of two sub-layers of conductive material.

Figure 6B:
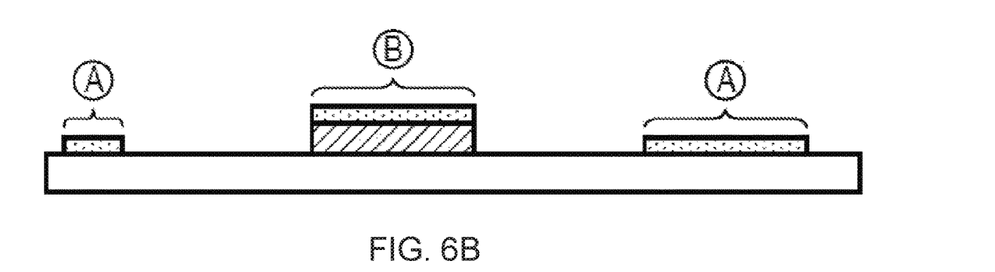
FIG. 6b shows a sectional view through the line X-X shown in FIG. 6b.

FIG. 6b shows a cross-sectional view through the line X-X of FIG. 6b.

Figure 6C:
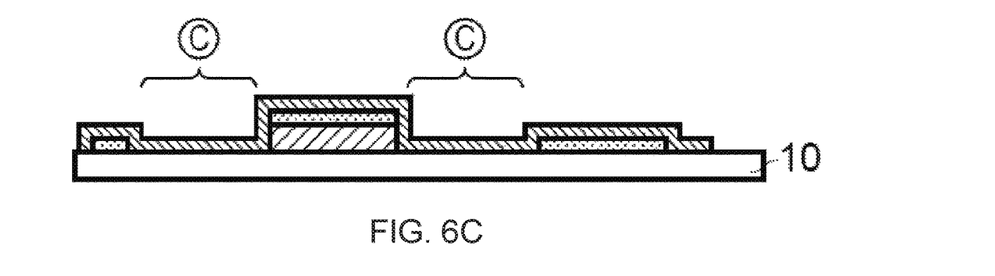
FIG. 6c shows a section through a conductive layer having three sub-layers.

Within the context of the present disclosure it is envisaged that the conductive layer may comprise three or more regions, wherein the thickness and/or conductivity of each region is different. Thus, as shown in FIG. 6c, it will be appreciated that according to a further example of the present disclosure, the conductive layer may comprise a third sub-layer which will form a third region C of the conductive layer. For example, a third sub-layer may comprise a continuous sheet of conductive material that is deposited as a third deposition step on top of both the first and second previously-deposited sub-layers. The third sub-layer will form the third region C and will also form a part of the underlying first and second regions.

Figure 7:
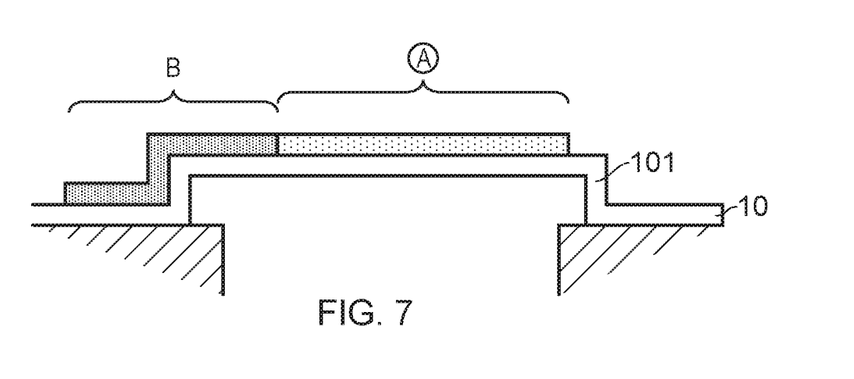
FIG. 7 shows a cross-sectional view of a further example.
Figure 8A:
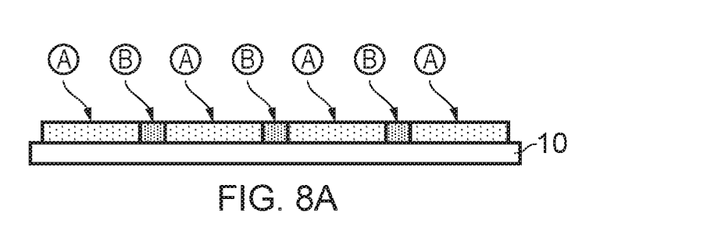
FIGS. 8a and 8b show further example structures.
Figure 8B:
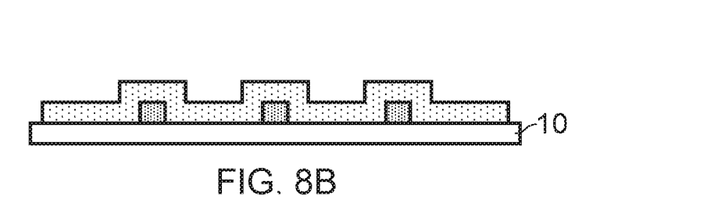

FIG. 7 shows a cross-sectional view through a further structure embodying the present disclosure and comprising a layer 10 of membrane material, which extends across a cavity formed in a substrate 105 to form a flexible membrane 101, and a layer 105 of conductive material deposited on the surface of the layer of membrane material. The conductive layer comprises at least one first region A having a first conductivity and at least one second region B having a second conductivity. In this example, the second region B is formed of a material having a greater conductivity than the material that forms region A. For example, the second region B may be advantageously formed of a metal or metal alloy, such as Aluminium, whilst the first region A may be advantageously formed of a conductive dielectric material, such as include titanium nitride, polysilicon, silicon carbide, amorphous silicon, tantalum nitride. The resistance of TiN is around 2-3 times higher than aluminium-silicon for the same thickness FIGS. 8a and 8b show further examples wherein a metal sub-layer is formed on the membrane surface and patterned to comprise a plurality of openings. The metal sub-layer thus forms a patterned second region B on the surface of a membrane layer 10 comprises a pattern of elements or interconnected tracks. A conductive dielectric material is then provided so as to substantially fill the openings provided in the patterned second layer. As shown in FIG. 8a, the upper surface of the resultant conductive layer may be planarised to provide an even thickness across the entire conductive layer. Alternatively, as shown in FIG. 8b, the conductive layer may exhibit a variation in thickness as a consequence of the deposition of the conductive dielectric material onto the underlying patterned metal layer.

A MEMS transducer according to the examples described here may comprise a capacitive sensor, for example a microphone.

A MEMS transducer according to the examples described here may further comprise readout circuitry, for example wherein the readout circuitry may comprise analogue and/or digital circuitry such as a low-noise amplifier, voltage reference and charge pump for providing higher-voltage bias, analogue-to-digital conversion or output digital interface or more complex analogue or digital signal processing. There may thus be provided an integrated circuit comprising a MEMS transducer as described in any of the examples herein.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

A MEMS transducer according to the examples described here may be located within a package having a sound port.

According to another aspect, there is provided an electronic device comprising a MEMS transducer according to any of the examples described herein. An electronic device may comprise, for example, at least one of: a portable device; a battery powered device; an audio device; a computing device; a communications device; a personal media player; a mobile telephone; a games device; and a voice controlled device.

According to another aspect, there is provided a method of fabricating a MEMS transducer as described in any of the examples herein.

Although the various examples describe a MEMS capacitive microphone, the examples described herein are also applicable to any form of MEMS transducers other than microphones, for example pressure sensors or ultrasonic transmitters/receivers.

Examples may be usefully implemented in a range of different material systems, however the examples described herein are particularly advantageous for MEMS transducers having membrane layers comprising silicon nitride.

In the examples described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the examples are also intended to embrace the output signal being derived by monitoring piezo-resistive or piezo-electric elements or indeed a light source. The examples are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the examples described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Examples may also be used in voice activated or voice controlled devices. Typical medical applications include hearing aids. Typical industrial applications include active noise cancellation. Typical automotive applications include hands-free sets, acoustic crash sensors and active noise cancellation.

It should be understood that the term upper should not be in any way construed as limiting to any particular orientation of the transducer during any fabrication step and/or it orientation in any package, or indeed the orientation of the package in any apparatus. The relative terms lower, above, below, underside, underneath etc. shall be construed accordingly.

It should be noted that the above-mentioned examples illustrate rather than limit the invention, and that those skilled in the art will be able to design many alternative examples without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising
a substrate having a cavity;
a layer of membrane material provided relative to the substrate, wherein the membrane material extends over the cavity; and
a layer of conductive material provided on a surface of the layer of membrane material;
the layer of conductive material comprising at least one first region having a first thickness and a first conductivity and at least one second region having a second thickness and a second conductivity, wherein the thickness and/or the conductivity of the/each first and second regions is different and wherein at least one second region of the conductive material is provided on a region of the surface of the layer of membrane material which is laterally outside the region of the layer of membrane material which overlies the cavity.

2. A MEMS transducer as claimed in claim 1, wherein the first region and the second region of the conductive material exhibit different thicknesses.

3. A MEMS transducer as claimed in claim 1, wherein the first and second regions form an electrically continuous conductive layer on the surface of the membrane.

4. A MEMS transducer as claimed in claim 1, wherein the second region of the layer of conductive material comprises first and second sub-layers of conductive material.

5. A MEMS transducer as claimed in claim 4, wherein at least one of the sub-layers comprises a layer of conductive material having at least one opening.

6. A MEMS transducer as claimed in claim 1, wherein at least one first region is provided on a region of the membrane which overlies the substrate cavity.

7. A MEMS transducer as claimed in claim 1, wherein the conductive material forming the first region comprises a continuous sheet of conductive material.

8. A MEMS transducer as claimed in claim 1, wherein the conductive material forming the first region comprises a layer of conductive material having at least one opening.

9. A MEMS transducer as claimed in claim 1, wherein the layer of conductive material forms a membrane electrode of the transducer.

10. A MEMS transducer as claimed in claim 9, wherein the layer of conductive material forms a conductive track which extends between the membrane electrode and a region for electrically coupling said membrane electrode to circuitry for readout.

11. A MEMS transducer as claimed in claim 10, wherein the track is at least partially formed of at least one second region.

12. A MEMS transducer as claimed in claim 1, wherein the layer of membrane material exhibits at least one step between a first level and a second level, and wherein at least one second region is provided on a region the layer of membrane material which includes said step.

13. A MEMS transducer as claimed in claim 1, wherein the second region comprises one or more elements or interconnected tracks which are provided on a region of the layer of membrane material which overlies the cavity.

14. A MEMS transducer as claimed in claim 1, wherein the first region and the second region of the conductive material exhibit different electrical conductivity.

15. A MEMS transducer as claimed in claim 14, wherein the first region exhibits a lower electrical conductivity than the second region.

16. A MEMS transducer as claimed in claim 15, wherein the first region comprises a conductive dielectric material.

17. A MEMS transducer as claimed in claim 14, wherein the second region comprises a metal material or a metal alloy material.

18. A MEMS transducer as claimed in claim 1, wherein said membrane comprises a crystalline or polycrystalline material.

19. A MEMS transducer as claimed in claim 1, wherein the conductive layer comprises three of more regions, each region having a different thickness and/or conductance to the other regions.

20. A MEMS transducer as claimed in claim 1 wherein said transducer comprises a capacitive sensor such as a capacitive microphone.

21. A MEMS transducer as claimed in claim 20 further comprising readout circuitry wherein the readout circuitry may comprise analogue and/or digital circuitry.

22. An electronic device comprising a MEMS transducer as claimed in claim 1, wherein said device is at least one of: a portable device; a battery powered device; an audio device; a computing device; a communications device; a personal media player; a mobile telephone; a games device; and a voice controlled device.

* * * * *

UNITED STATES PATENT AND TRADEMARK OFFICE
CERTIFICATE OF CORRECTION

PATENT NO. : 10,343,894 B2
APPLICATION NO. : 15/676430
DATED : July 9, 2019
INVENTOR(S) : Duffy et al.

It is certified that error appears in the above-identified patent and that said Letters Patent is hereby corrected as shown below:

In the Specification

In Column 6, Line 5, delete "layer, which" and insert -- layer, in which --, therefor.

In Column 6, Line 20, delete "conducive" and insert -- conductive --, therefor.

In Column 7, Line 64, delete "a sectional" and insert -- a cross-sectional --, therefor.

In Column 8, Line 24, delete "conducive" and insert -- conductive --, therefor.

In Column 10, Line 3, delete "thickness" and insert -- thickness. --, therefor.

In Column 11, Line 45, delete "it" and insert -- it's --, therefor.

In the Claims

Please amend Claim 1 as follows:
1. A MEMS transducer comprising:
    a substrate having a cavity;
    a layer of membrane material provided relative to the substrate, wherein the membrane material extends over the cavity; and
    a layer of conductive material provided on a surface of the layer of membrane material;
    the layer of conductive material comprising at least one first region having a first thickness and a first conductivity and at least one second region having a second thickness and a second conductivity, wherein the thickness and/or the conductivity of the/each first and second regions is different and wherein at least one second region of the conductive material is provided on a region of the surface of the layer of membrane material which is laterally outside the region of the layer of membrane material which overlies the cavity.

Signed and Sealed this
Tenth Day of December, 2019

Andrei Iancu
*Director of the United States Patent and Trademark Office*

Please amend Claim 12 as follows:

12. A MEMS transducer as claimed in claim 1, wherein the layer of membrane material exhibits at least one step between a first level and a second level, and wherein at least one second region is provided on a region of the layer of membrane material which includes said step.

Please amend Claim 19 as follows:

19. A MEMS transducer as claimed in claim 1, wherein the conductive layer comprises three or more regions, each region having a different thickness and/or conductance to the other regions.